United States Patent
Lin

(10) Patent No.: US 7,852,699 B2
(45) Date of Patent: Dec. 14, 2010

(54) POWER SAVING METHOD AND CIRCUIT THEREOF FOR A SEMICONDUCTOR MEMORY

(75) Inventor: Yung-Feng Lin, Dasi Township, Taoyuan County (TW)

(73) Assignee: Macronix International Co., Ltd., Hsinchu (TW)

( * ) Notice: Subject to any disclaimer, the term of this patent is extended or adjusted under 35 U.S.C. 154(b) by 292 days.

(21) Appl. No.: 11/867,023

(22) Filed: Oct. 4, 2007

(65) Prior Publication Data

US 2009/0091998 A1    Apr. 9, 2009

(51) Int. Cl.
*G11C 5/14* (2006.01)
(52) U.S. Cl. .............. 365/227; 365/185.27; 365/230.06
(58) Field of Classification Search ............ 365/227, 365/185.27, 230.06
See application file for complete search history.

(56) References Cited

U.S. PATENT DOCUMENTS

| | | | | |
|---|---|---|---|---|
| 5,272,673 A * | 12/1993 | Sugibayashi | ............... | 365/201 |
| 5,822,252 A * | 10/1998 | Lee et al. | ................. | 365/185.3 |
| 6,777,292 B2 * | 8/2004 | Lee et al. | .................... | 438/257 |
| 7,254,081 B2 * | 8/2007 | Sugawara et al. | ........... | 365/226 |
| 7,313,029 B2 * | 12/2007 | Shen et al. | ............ | 365/185.29 |
| 2006/0077745 A1 * | 4/2006 | Kitazaki et al. | ............ | 365/226 |

* cited by examiner

*Primary Examiner*—Tuan T Nguyen
*Assistant Examiner*—R Lance Reidlinger
(74) *Attorney, Agent, or Firm*—Volpe and Koenig, PC

(57) ABSTRACT

A power saving method for a semiconductor memory is provided. The power saving method for a semiconductor memory including the steps of receiving a plurality of address codes, each of which has a first part code and a second part code; and activating a first boost process when the first part code of a currently received address code is different from the first part code of a last received address code, otherwise a second boost process is activated.

11 Claims, 3 Drawing Sheets

POWER SAVING METHOD AND CIRCUIT THEREOF FOR A SEMICONDUCTOR MEMORY

FIELD OF THE INVENTION

The present invention relates to a power saving method and circuit for a semiconductor memory, in particular, to a power saving word line boost method and a decoder for implementing the method.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and Flash memory, wherein the ROM and the Flash memory are also resided in non-volatile memory.

For a conventional Flash memory device, a plurality of one-transistor core cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions. One type of architecture used for Flash memories is typically referred to as a NOR Flash memory architecture which is an array of Flash EEPROM cells which are divided into a plurality of sectors. Further, the memory cells within each sector are arranged in rows of wordlines and columns of bit lines intersecting the rows of wordlines. To sum up, a typical flash memory comprises a memory array, which includes a large number of memory cells divided in sectors. The flash memory is differentiated from other non-volatile memory in that flash memory cells can be erased and reprogrammed in blocks instead of one byte at a time.

Furthermore, for the cells in the Flash memory, each of the flash memory cells is connected with a row or X-decoder but a column or Y-decoder is shared by multiple memory cells. An example of a typical memory cell architecture is illustrated in FIG. 1, which is a diagram illustrating an conventional architecture of a plurality of memory cells corresponded with a plurality of decoders for a semiconductor memory. This architecture uses an X-decoder for each cell of memory. FIG. 1 shows two columns of memory cells. Each column is comprised of eight flash memory array cells 100-115. Each memory array cell 100-115 has a dedicated X-decoder 1101-1115 respectively, and each column of cells is shared a Y-decoder 131-132 respectively.

In order for memory manufacturers to remain competitive, memory designers must constantly increase the density, shrank the entire size, reduce the power consumption and enhance read speed of flash memory devices. In particular, there has arisen a need to provide a way of reducing the power consumption or the capacitive loading in Flash memory X-decoder in order to produce accurate voltage control at selected wordlines.

For the requirements stated above, and for other reasons stated below which will become apparent to those skilled in the art upon reading and understanding the present specification, there is a need in the art for a memory decoding architecture that reduces power consumption for reading operation in a semiconductor memory. Hence a novel power saving method and decoder for a semiconductor memory is thus provided.

SUMMARY OF THE INVENTION

It is therefore an object of the present invention to propose a power saving method and circuit for a semiconductor memory. The present invention provides a power saving word line boost scheme. Read speed and power consumption are respectively improved and reduced by dividing loading and recycling the boosted well power.

According to the first aspect of the present invention, a power saving method for a semiconductor memory including the steps of providing a memory array having a plurality of memory cells divided into a plurality of sectors, wherein a part of the plurality of sectors arranged in the same row is disposed on a well region; receiving a plurality of the address codes, each of which has a first part code and a second part code, wherein the first part code is addressed for the well region; and activating a first boost process when the first part code of a currently received address code is different from the first part code of a last received address code, otherwise a second boost process is activated.

Preferably, the semiconductor memory is a Flash memory.

Preferably, the first boost process is used to boost the well region for which the first part code of the currently received address code is addressed.

Preferably, the second boost process is used to maintain a voltage of the well region by a small boost.

According to the second aspect of the present invention, a power saving method for a semiconductor memory including the steps of receiving a plurality of address codes, each of which has a first part code and a second part code; and activating a first boost process when the first part code of a currently received address code is different from the first part code of a last received address code, otherwise a second boost process is activated.

Preferably, the semiconductor memory is a Flash memory.

Preferably, a plurality of well regions is addressed by the first part of the address code.

Preferably, the first boost process is used to boost a well region for which the first part code of the currently received address code is addressed.

Preferably, the second boost process is used to maintain a voltage of the well region by a small boost.

According to the third aspect of the present invention, a power saving circuit for reducing power consumption for a semiconductor memory including a circuit receiving a plurality of address codes, each of which has a first part code and a second part code; and wherein a first boost process is activated when the first part code of a currently received address code is different from the first part code of a last received address code, otherwise a second boost process is activated.

Preferably, the semiconductor memory is a Flash memory.

Preferably, a plurality of well regions is addressed by the first part of the address code.

Preferably, the first boost process is used to boost a well region for which the first part code of the currently received address code is addressed.

Preferably, the second boost process is used to maintain a voltage of the well region by a small boost.

The foregoing and other features and advantages of the present invention will be more clearly understood through the following descriptions with reference to the drawings:

DETAILED DESCRIPTION OF THE PREFERRED EMBODIMENT

The present invention will now be described more specifically with reference to the following embodiments. It is to be noted that the following descriptions of preferred embodiments of this invention are presented herein for the aspect of illustration and description only, it is not intended to be exhaustive or to be limited to the precise form disclosed.

For the sake of reducing the power consumption for a semiconductor memory, if we charge/discharge the well loading in each read operation, it will consume too much unnecessary current. Since it is understood that usually a plurality of one-transistor core cells may be formed on a semiconductor substrate in which each cell is comprised of a P-type conductivity substrate, an N-type conductivity source region formed integrally with the substrate, and an N-type conductivity drain region also formed integrally within the substrate. And a P-type channel region in the substrate separates the source and drain regions. Thus the plurality of memory sectors arranged in the same row would share with the identical well region. Furthermore, in accordance with the characteristics of code with "local of reference", it is inspired therefrom that the well loading could only be re-setup when there are many address changes.

Figure 1:
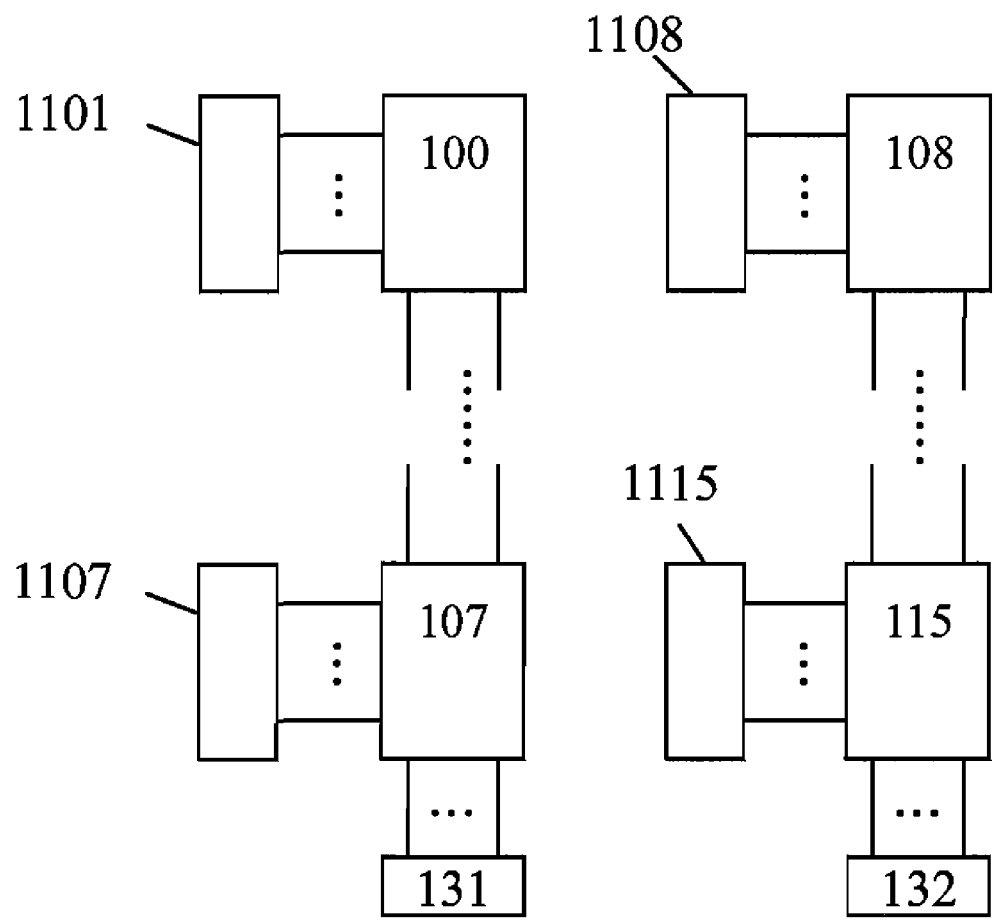
FIG. 1 is a diagram illustrating an conventional architecture of a plurality of memory cells corresponded with a plurality of decoders for a semiconductor memory.
Figure 2:
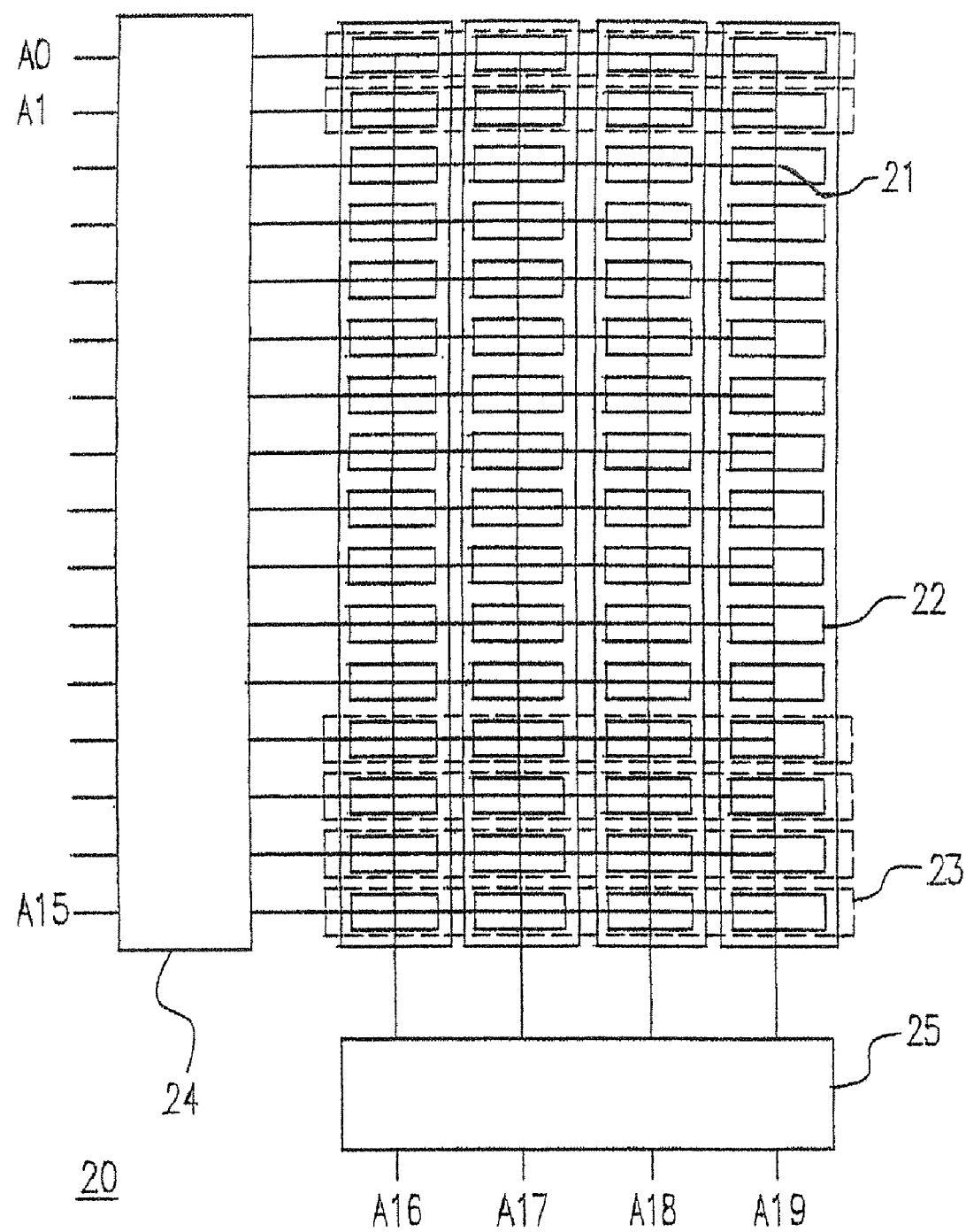
FIG. 2 is a diagram illustrating a power saving architecture of a memory cell for a semiconductor memory.

In order to further demonstrate the power saving method, a preferred embodiment is provided as follows. Please refer to the FIG. 2, which is a diagram illustrating a power saving architecture of a memory cell for a semiconductor memory. It is demonstrated in FIG. 2 a scramble of 32Mbit array with 16I/O and 64sectors with capacity 0.5Mbit/sector for a flash memory where X decoder was showed only. A memory array 20 disclosed in FIG. 2 includes a plurality of memory cells 21, a plurality of sectors 22, a plurality of well regions 23, a row-decoder 24 and a column decoder 25. Wherein the memory array 20 is a 32 Mbit array including four memory cells 21, each of which is then divided into sixteen sectors 22. Each of the totally sixty-four sectors 22 has the capacity of 0.5 Mbit/sector and is numbered from Sec 0 to Sec 63 herein. The respective address signals inputted into the row-decoder 24 from top to bottom is A0-A15 and the respective address signals inputted into the column decoder 25 from left to right is A16-A19.

Since for each read operation, when address signals A16-A19 are changed, it means that the row address is correspondingly changed. Otherwise when the address signals A16-A19 are not changed, it means that the row address is not changed and the sectors arranged in the same row could keep sharing the same well region. Thus once it is detected that the current received address signals A16-A19 are different from the last received address signals A16-A19, a well boost would be activated for activating a well region whose type is different from the present well region. Otherwise, the current received address signals A16-A19 are the same with the last received address signals A16-A19, an internal read operation is triggered, that is the voltage of the well region would be maintained by a small boost, so as to trigger an internal read operation.

Figure 3:
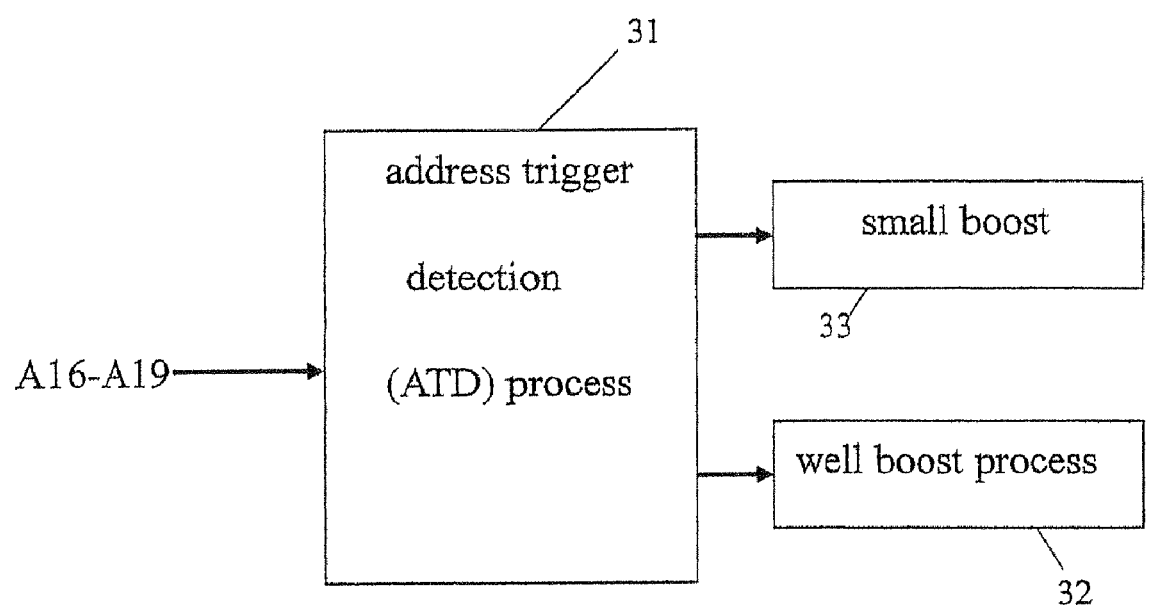
FIG. 3 is a flow chart illustrating the process for implementing the power saving method for a semiconductor memory.

For the preceding mentioned method, it could be able to be generalized in FIG. 3, which is a flow chart illustrating the process for implementing the power saving method for a semiconductor memory. Following steps are included in FIG. 3: an address trigger detection (ATD) process 31, a well boost process 32 for activating a well region, and a small boost 33 for activating an internal read operation. First, the address signals A16-A19 are inputted into the ATD process 31. If the current received address signals A16-A19 are different from a last received address signals A16-A19, the well boost process 32 would be activated for activating a well region, otherwise a small boost 33 for activating an internal read operation keeps performing.

To sum up the aforementioned method, since the power demanding for internal read operation is smaller than that for well boost and the well boost process is not activated for every read operation on the basis of the method, the demanding for power consumption is thus well reduced. Hence, the present power saving method for a semiconductor and the decoder presented by the present application indeed achieve the anticipated effect. The present invention not only bears a novelty and a progressive nature, but also bears a utility.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims that are to be accorded with the broadest interpretation, so as to encompass all such modifications and similar structures. According, the invention is not limited by the disclosure, but instead its scope is to be determined entirely by reference to the following claims.

What is claimed is:

1. A power saving method for a semiconductor memory having a well region, comprising the steps of:
   receiving a plurality of address codes, each of which has a first part code and a second part code; and
   activating a first boost process when the first part code of a currently received address code is different from the first part code of a last received address code, otherwise a second boost process that maintains a voltage of the well region is activated.

2. A method according to claim 1, wherein the semiconductor memory is a Flash memory.

3. A method according to claim 1, wherein the well region is addressed by the first part code of the address code.

4. A method according to claim 1, wherein the first boost process is used to boost the well region for which the first part code of the currently received address code is addressed.

5. A power saving method for a semiconductor memory, comprising the steps of:
   providing a memory array having a plurality of memory cells divided into a plurality of sectors, wherein a part is activated
   receiving a plurality of address codes, each of which has a first part code and a second part code, wherein the first part code is addressed for the well region; and
   activating a first boost process when the first part code of a currently received address code is different from the first part code of a last received address code, otherwise a second boost process that maintains a voltage of the well region is activated.

6. A method according to claim 5, wherein the semiconductor memory is a Flash memory.

7. A method according to claim 5, wherein the first boost process is used to boost the well region for which the first part code of the currently received address code is addressed.

8. A power saving circuit for reducing power consumption for a semiconductor memory having a well region, comprising:
   a receiving circuit receiving a plurality of address codes, each of which has a first part code and a second part code; and
   an activating circuit activating a first boost process when the first part code of a currently received address code is different from the first part code of a last received address code, otherwise activating a second boost process that maintains a voltage of the well region.

9. A power saving circuit according to claim 8, wherein the semiconductor memory is a Flash memory.

10. A power saving circuit according to claim 8, wherein well regions is addressed by the first part code of the address code.

11. A power saving circuit according to claim 8, wherein the first boost process is used to boost the well region for which the first part code of the currently received address code is addressed.

* * * * *